US010826321B1

(12) United States Patent
Gardner et al.

(10) Patent No.: US 10,826,321 B1
(45) Date of Patent: Nov. 3, 2020

(54) POWER BUSWAY TAP BOX

(71) Applicant: Amazon Technologies, Inc., Seattle, WA (US)

(72) Inventors: Brock Robert Gardner, Seattle, WA (US); Peter George Ross, Olympia, WA (US)

(73) Assignee: Amazon Technologies, Inc., Seattle, WA (US)

(*) Notice: Subject to any disclaimer, the term of this patent is extended or adjusted under 35 U.S.C. 154(b) by 660 days.

(21) Appl. No.: 15/426,922

(22) Filed: Feb. 7, 2017

(51) Int. Cl.
| | |
|---|---|
| *H02J 9/00* | (2006.01) |
| *H02M 7/00* | (2006.01) |
| *H05K 7/14* | (2006.01) |
| *H02H 7/20* | (2006.01) |
| *H02B 1/21* | (2006.01) |

(52) U.S. Cl.
CPC ............ *H02J 9/00* (2013.01); *H02H 7/20* (2013.01); *H02M 7/003* (2013.01); *H05K 7/1492* (2013.01); *H02B 1/21* (2013.01)

(58) Field of Classification Search
CPC ...................................................... H02J 9/061
See application file for complete search history.

(56) References Cited

U.S. PATENT DOCUMENTS

| 7,495,415 | B2 * | 2/2009 | Kanouda | G06F 1/30 |
| | | | | 307/66 |
| 8,446,039 | B2 * | 5/2013 | Ziegler | H02J 9/062 |
| | | | | 174/68.1 |
| 9,864,669 | B1 * | 1/2018 | Klein | G06F 11/325 |
| 2004/0231875 | A1 * | 11/2004 | Rasmussen | G06F 1/189 |
| | | | | 174/50 |
| 2011/0187197 | A1 * | 8/2011 | Moth | H02J 9/062 |
| | | | | 307/66 |
| 2013/0198533 | A1 * | 8/2013 | Bailey | G06F 1/30 |
| | | | | 713/300 |

(Continued)

OTHER PUBLICATIONS

"Busway Tap Box, Bus Box & Terminal Boxes: Bay Power." Bay Power Electrical Solutions, Apr. 6, 2019, www.baypower.com/electrical-distribution/busway/tap-terminal-boxes. (Year: 2019).*

(Continued)

*Primary Examiner* — Daniel J Cavallari
(74) *Attorney, Agent, or Firm* — Kilpatrick Townsend & Stockton LLP

(57) ABSTRACT

A power busway tap box with integrated uninterruptable power supply (UPS) functionality is enabled. A busway may be utilized to distribute electrical power throughout a data center. A busway tap box may incorporate one or more components providing UPS functionality. When the busway is distributing alternating current (AC) power, the tap box may incorporate a rectifier, an electrical energy storage device (e.g., a lithium-ion battery), and an inverter. The tap box may keep a substantially conventional form factor, or an extended form factor to accommodate larger electrical energy storage device sizes. The busways may run overhead in a data center and the tap boxes may physically couple with the overhead busways and be disposed beneath them. By distributing the UPS functionality throughout the data center, the impact of UPS failures may be lowered and/or environmental maintenance costs may be reduced.

20 Claims, 7 Drawing Sheets

(56) References Cited

U.S. PATENT DOCUMENTS

2014/0292167 A1* 10/2014 Sojka .................. H05K 7/1498
312/234

OTHER PUBLICATIONS

GE Industrial, "Section 13: Busway", *GE Buylog™ Catalog* (Oct. 2016), 96 pages.
Schneider Electric USA, Inc., "Busway Systems, " *Catalog 5600CT9101R03/12* (2012), 156 pages.

* cited by examiner

POWER BUSWAY TAP BOX

BACKGROUND

In response to demand for computing services, large data centers full of computing equipment have become common. One aspect of maintaining such data centers is the reliable provision of electrical power to the computing equipment. Conventional solutions to the reliable provision of power have shortcomings. For example, while the establishment of an uninterruptable power supply (UPS) is not uncommon, conventional uninterruptable power supplies for larger data centers tend to involve bulky, electronics-unfriendly equipment such as lead-acid batteries or flywheels. Accordingly, such conventional uninterruptable power supplies are often physically separated from the computing equipment, and practical power supply cabling means that conventional uninterruptable power supplies tend to each supply large numbers of pieces of computer equipment (e.g., hundreds of racks of computer servers). Although failures are relatively rare, this arrangement means that failure of conventional uninterruptable power supplies can cause a large scale outage of computing services. In addition, optimizing (e.g., minimizing) failure rates typically requires careful environmental maintenance (e.g., with respect to temperature range) which can be costly.

BRIEF DESCRIPTION OF THE DRAWINGS

Various embodiments in accordance with the present disclosure will be described with reference to the drawings, in which.

DETAILED DESCRIPTION

Figure 1:
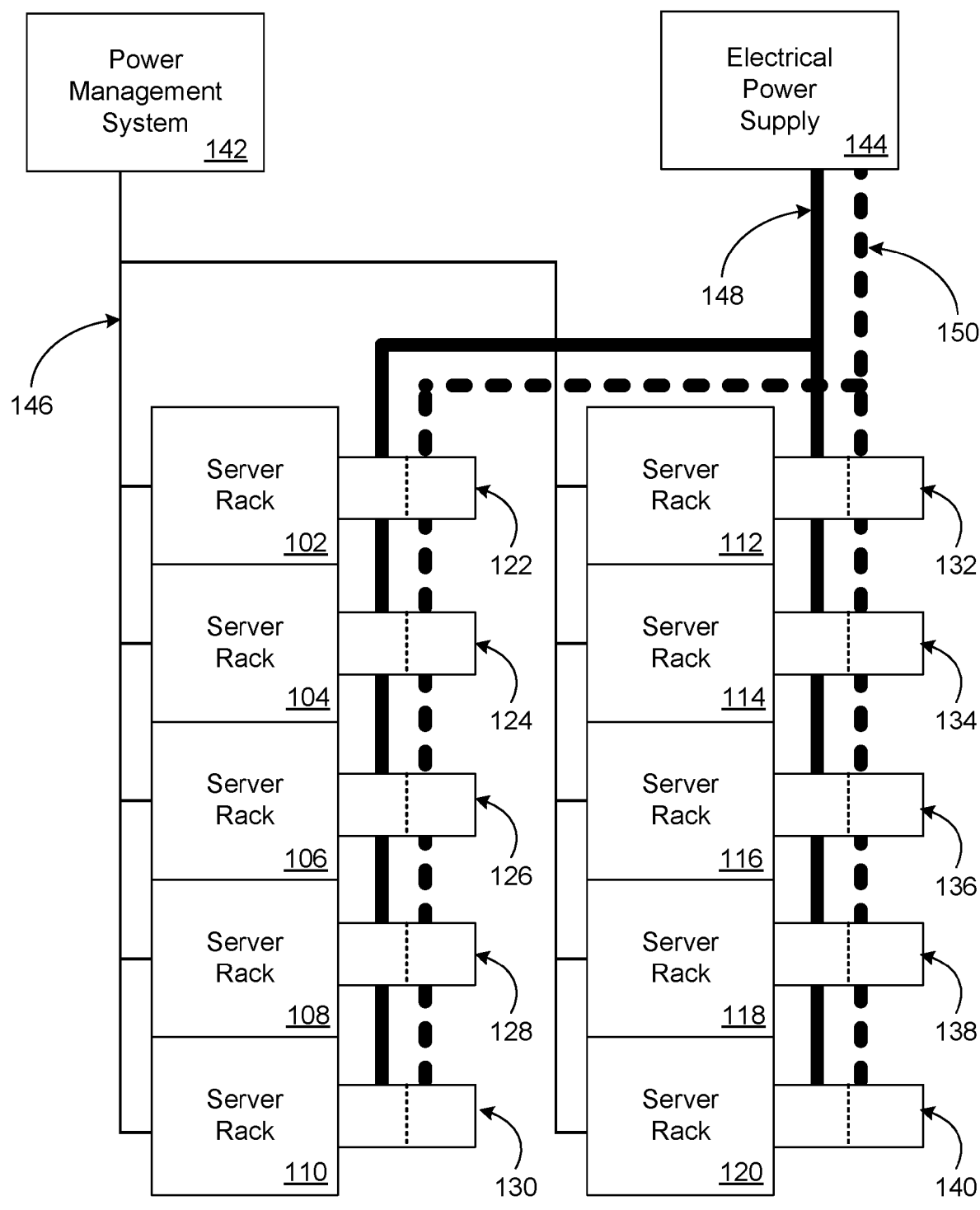
FIG. 1 is a schematic diagram depicting an example power distribution environment in accordance with at least one embodiment.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

In accordance with at least one embodiment, a power busway tap box with integrated uninterruptable power supply (UPS) functionality is enabled. An electrical power busway (or "bus duct") may be utilized to distribute electrical power throughout a data center. A busway tap box may incorporate one or more components providing UPS functionality. For example, when the busway is distributing alternating current (AC) power, the tap box may incorporate a rectifier, an electrical energy storage device (e.g., a lithium-ion battery), and an inverter. When the busway is distributing direct current (DC) power, the rectifier and inverter may be omitted. Although the tap box incorporates components providing UPS functionality, the tap box may keep a substantially conventional form factor, or an extended form factor to accommodate larger electrical energy storage device sizes, for example having a relatively low multiple of the conventional form factor size (e.g., 2 times, 3 times or 5 times the volume and/or external dimension). Tap box form factors in accordance with at least one embodiment are discussed below in more detail with reference to FIG. 3. The tap boxes may connect with the busway utilizing a removable electrical coupling. The busways may run overhead in a data center and the tap boxes may physically couple with the overhead busways and be disposed beneath them (e.g., hang from the overhead busways) when electrically coupled. Any suitable conventional busway may be utilized.

Tap boxes with integrated UPS functionality may provide an uninterruptable power supply to one or more racks of computer equipment (e.g., between 1 and 3 such racks, or another number of racks). By distributing the UPS functionality throughout the data center, the impact of UPS failures may be lowered (e.g., by one or more orders of magnitude) and/or environmental maintenance costs may be reduced (e.g., by utilizing lithium-ion batteries with wider environmental tolerances) compared to a centralized or non-distributed UPS configuration. Examples of such benefits are described below in more detail with reference to FIG. 1. The energy storage device may be removable and/or replaceable without interrupting power flowing through the tap box, e.g., enabling "hot swap" replacement of energy storage devices that are performing suboptimally. The tap boxes may include a management module that monitors and controls the components of the tap box including the components providing UPS functionality. The management module may monitor operational parameters of the tap box and cause one or more visual indicators to indicate tap box status, error conditions, charge levels, circuit breaker trip state and any suitable operational parameter. The tap box may include a communication interface to provide status data to a centralized power management system (e.g., for the whole data center).

Tap boxes may be individually addressable (e.g., with an internetworking protocol) and may have fixed or dynamically assigned addresses and/or serial numbers. Such addresses and/or serial numbers may be encoded in firmware and/or set with a DIP switch. A tap box may have a barcode on an interior and/or exterior surface corresponding to such addresses, serial numbers and/or any suitable tap box identifier. Where tap boxes supply UPS functionality to racks of computer equipment with rack controllers, the tap box may become a managed device of the rack controller, e.g., in accordance with a simple network management protocol such as SNMP. In accordance with at least one embodiment, computer equipment racks and thus rack controllers may be associated with a physical location in a data center, and the tap box may be associated with one or more such rack controllers when the tap box becomes a managed device. Accordingly, a physical location of a newly installed or moved tap box may be automatically determined based on its associated rack controllers. Alternatively, or in addition, tap boxes may be managed independently of rack controllers and/or may incorporate rack controller functionality, and tap box location in a data center may be ascertained independently of any connected server racks. For example, tap box identifiers and data center location identifiers may be scanned from corresponding barcodes and associated in a database. Tap boxes may be managed utilizing any suitable device management protocol including protocols in accordance with the MODBUS® series of serial communication protocol standards.

FIG. 1 depicts an example power distribution environment 100 in accordance with at least one embodiment. In the example environment 100, an electrical power supply 144 distributes electric power to server racks 102, 104, 106, 108, 110, 112, 114, 116, 118, 120 of computing equipment utilizing one or more electrical power busways 148, 150. In accordance with at least one embodiment, multiple busways 148, 150 are utilized for redundancy to improve a reliability of electric power supply. In this example, each server rack 102, 104, 106, 108, 110, 112, 114, 116, 118, 120 is provided power from the busways 148, 150 by a corresponding pair of tap boxes 122, 124, 126, 128, 130, 132, 134, 136, 138, 140, respectively. In each pair of tap boxes 122, 124, 126, 128, 130, 132, 134, 136, 138, 140 (indicated as a pair by the dashed line spitting the larger box), one of the tap boxes (e.g., the left box of the pair) draws electric power from the first electrical power busway 148 (e.g., a "side A" or "hot aisle" busway), while the other tap box (e.g., the right box of the pair) draws electrical power from the second electrical power busway 150 (e.g., a "side B" or "cold aisle" busway). In other examples, tap boxes and/or tap box pairs may provide electric power to more than one rack. In this example, the server racks 102, 104, 106, 108, 110, 112, 114, 116, 118, 120 are also connected to a power management system 142 utilizing a communication connection 146. For example, as described in more detail below with reference to FIG. 2, each rack may include a rack controller that provides rack-level power management functionality.

In a conventional power distribution environment, it may be that UPS functionality is concentrated or centralized; for example, the UPS functionality may be integrated with the electrical power supply 144, with tap boxes 122, 124, 126, 128, 130, 132, 134, 136, 138, 140 having no UPS functionality. In such a scenario, a failure of the concentrated UPS functionality may result in loss of power to a large number of equipment racks, e.g., each of the depicted server racks 102, 104, 106, 108, 110, 112, 114, 116, 118, 120. In accordance with at least one embodiment, in contrast, each of the tap boxes 122, 124, 126, 128, 130, 132, 134, 136, 138, 140 may incorporate UPS functionality that operates independently, e.g., the UPS functionality may be partially or wholly distributed among the tap boxes 122, 124, 126, 128, 130, 132, 134, 136, 138, 140. A failure of UPS functionality in one tap box need not cause or correspond to a failure of UPS functionality in a different tap box. Accordingly, in the distributed USP functionality configuration, a failure of USP functionality in a single tap box (e.g., tap box 126) may result in a loss of power to a lower number of racks (e.g., a loss of power only to rack 106). In environments with large numbers of racks, a distributed UPS functionality strategy in accordance with at least one embodiment can reduce the number of racks impacted by one or more orders of magnitude. This can be particularly effective in computer data centers where the racks hold multiple computer systems configured as servers, since such data centers are often tolerant to (and even designed for) losses of small numbers of computer servers (e.g., may quickly recover full operation due to a designed level of redundancy), but may take longer to recover from a loss of large numbers of computer servers (e.g., because the required level of redundancy is not available in such circumstances). Alternatively, or in addition, conventional centralized or concentrated UPS functionality configurations may require specialized and/or additional cooling and/or climate control that is not required in a distributed UPS functionality configuration. The distributed UPS configuration thereby lowers associated environmental maintenance costs.

Figure 2:
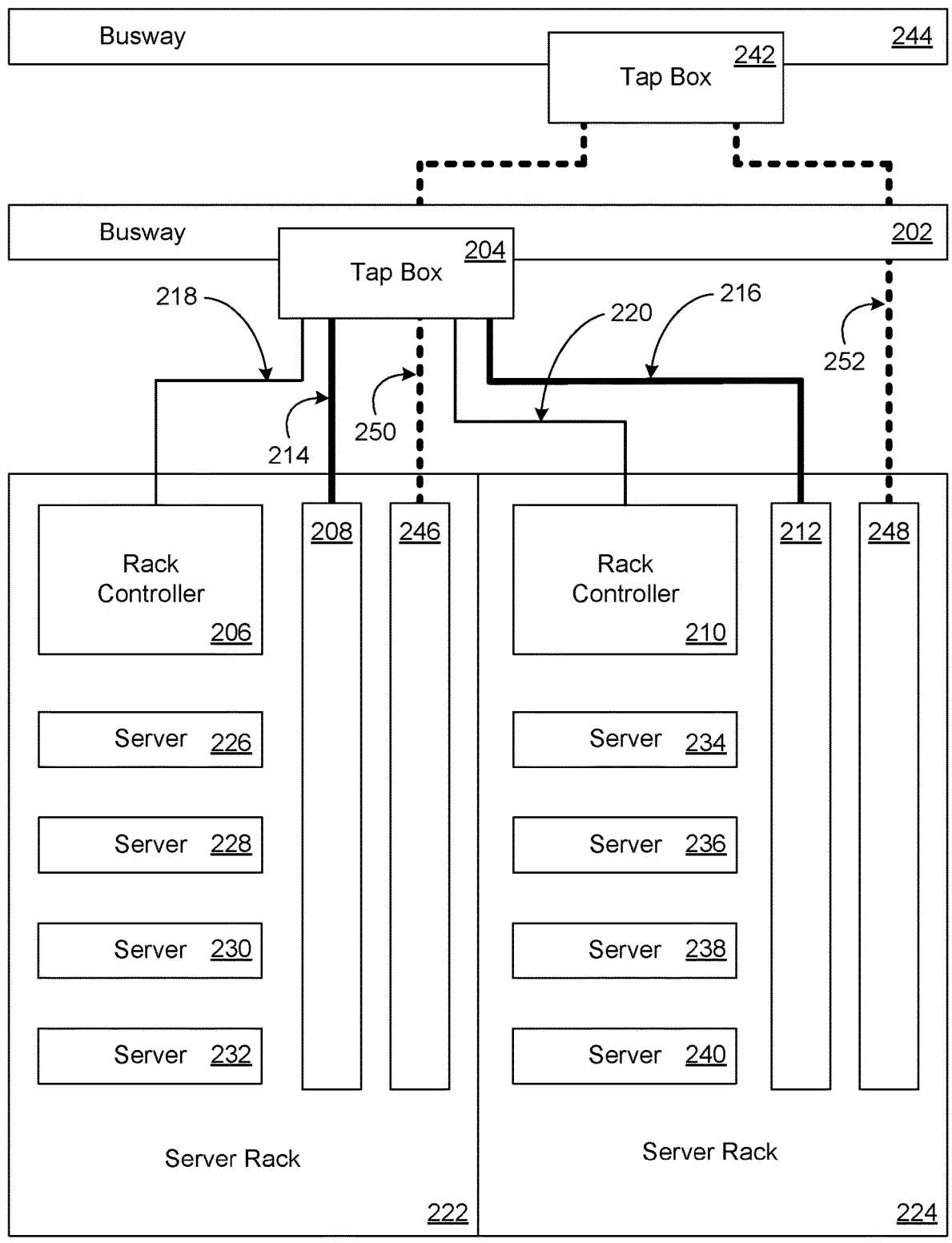
FIG. 2 is a schematic diagram depicting an example tap box use case in accordance with at least one embodiment.

FIG. 2 depicts an example tap box use case 200 in accordance with at least one embodiment. In this example 200, a first tap box 204 provides electric power from a first busway 202 to each of two racks 222, 224 of server computers 226, 228, 230, 232, 234, 236, 238, 240 (two "server racks"). For example, a server computer may be a computer system configured as a server, service provider and/or application functionality host. The first tap box 204 is connected to a first rack-level power bus 208, 212 (e.g., a rack power distribution unit or PDU) with removable electrical power couplings 214, 216 (e.g., conventional electric power cabling). For redundancy, a second tap box 242 provides electric power from a second busway 244 to each of the two server racks 222, 224. The second tap box 242 is connected to a second rack-level power bus 246, 248 with removable electrical power couplings 250, 252. For example, the busways 202, 244 may correspond to busways 148, 150 of FIG. 1, and the tap boxes 204, 242 may corresponding to a tap box pair (although, in this example 200, each tap box 204, 242 of the pair is providing power to multiple server racks 222, 224). The first tap box 204 is also connected to rack controllers 206, 210 with removable communication couplings 218, 220 (e.g., Ethernet cabling). The second tap box 242 may also be connected to the rack controllers 206, 210, however the corresponding removable communication couplings are omitted from FIG. 2 for clarity. In accordance with at least one embodiment, the rack controllers 206, 210 may correspond to network devices that collect and provide information (e.g., status information) pertaining to corresponding server racks 222, 224. For example, rack controller 206 may register rack components 226, 228, 230, 232, 208, 246 as managed devices utilizing a simple network management protocol (e.g., SNMP) and/or serial communication protocol (e.g., MODBUS), provide component parameter information to the power management system 142 (FIG. 1) and/or receive commands (e.g., conventional SNMP commands and/or conventional MODBUS commands) from the power management system 142. Alternatively, or in addition, rack controllers 206, 210 may correspond to network switches (e.g., a "top of rack switch" or communications network switch that routes some or all network communications between rack components 226, 228, 230, 232, 208, 246 and one or more other networks, or internetworks including the public internet). In accordance with at least one embodiment, some or all rack controller 206 functionality may be incorporated into one or more coupled tap boxes 204, 244, individually or collectively.

Figure 3:
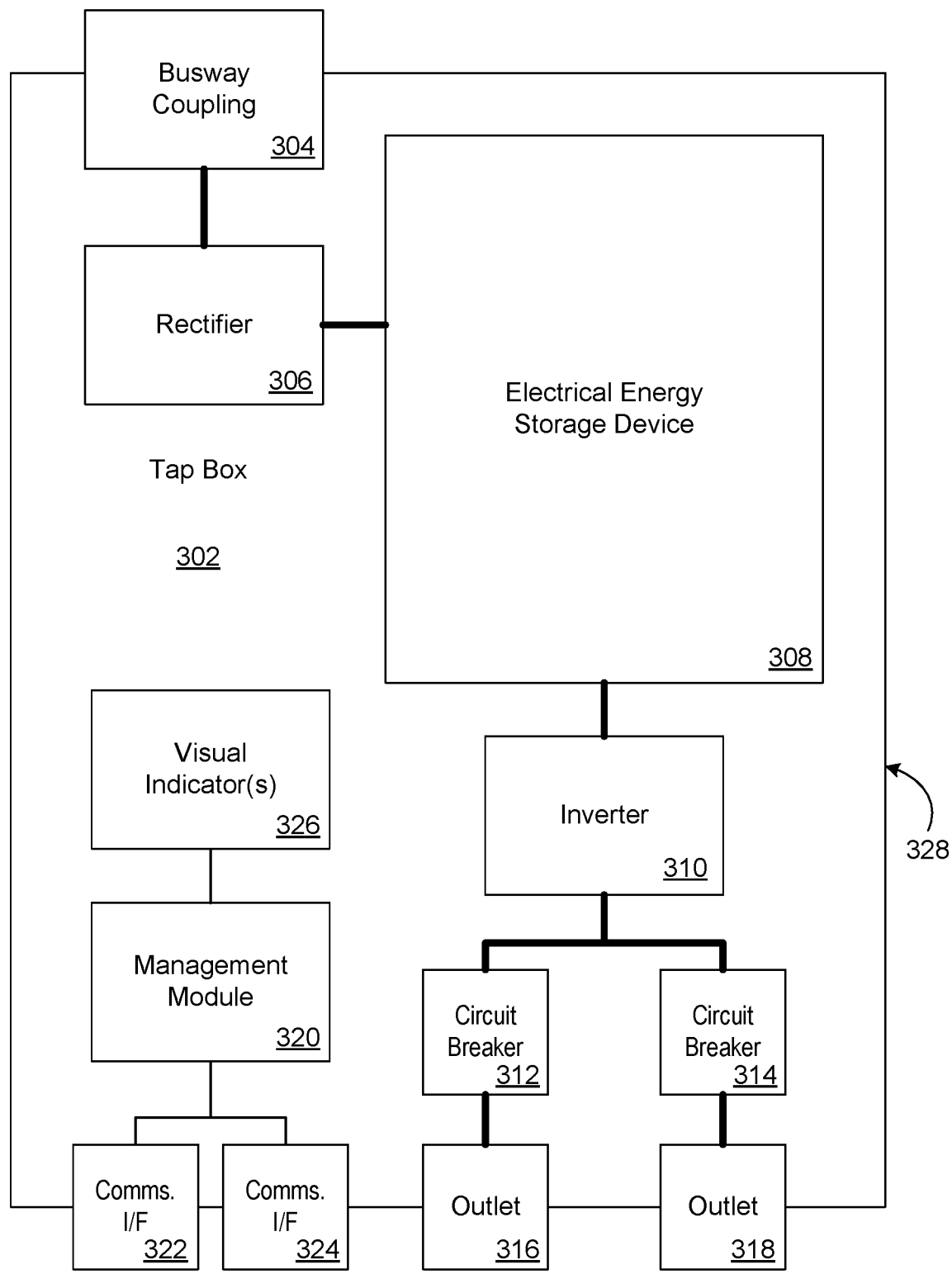
FIG. 3 is a schematic diagram depicting an example power busway tap box with UPS functionality in accordance with at least one embodiment.

FIG. 3 depicts an example power busway tap box with UPS functionality 302 in accordance with at least one embodiment. FIG. 3 is not to scale and depicts a logical rather than a physical arrangement of components 304, 306, 308, 310, 312, 314, 316, 318, 320, 322, 324, 326. The tap box 302 includes a busway coupling 304 configured to removably couple the tap box 302 and/or its components with the busway (e.g., the busway 202 of FIG. 2). In this example, the busway is providing AC power, and the AC power is provided to a rectifier 306 to generate DC power that is stored in an electrical energy storage device 308 (e.g., a lithium-ion battery, another type of battery, a fuel cell, a capacitor). The electrical energy storage device 308 provides DC power to an inverter 310 that generates AC power provided to one or more power outlets 316, 318 through corresponding circuit breakers 312, 314. In accordance with at least one embodiment, the electrical energy storage device 308 may enable the tap box 302 to provide electric energy to one or more consumers (e.g., via the outlets 316, 318) even when the tap box 302 is not receiving electric energy from the busway. That is, the tap box 302 may provide UPS functionality. The circuit breakers 312, 314 may be configured to detect one or more fault conditions in the flow of electrical power through the circuit breakers 312, 314 including excessive and/or unsafe levels of current and, upon detecting the fault condition(s), interrupt the flow of electrical power through the circuit breakers 312, 314 (e.g., may "trip") and to any consumers of electrical power coupled with the outlets 316, 318 thereby at least in part protecting such consumers, the components 304, 306, 308, 310, 312, 314, 316, 318, 320, 322, 324, 326 of the tap box 302, and/or other downstream components or users from the fault condition.

In this example, the power consumers utilize AC power, however in an all DC power system, the inverter 310 and the rectifier 306 may be omitted. A management module 320 may monitor and control the components of the tap box 302 and may display tap box operational parameters (e.g., status, component status including rectifier status and inverter status, error conditions including error condition on shutoff, charge levels, time of last discharge, battery installation date, component temperature including energy storage device temperature, circuit breaker trip state) with one or more visual indicators 326. The indicators 326 can comprise, for example, LEDs, displays, gauges, or other devices. Alternatively, or in addition, the management module 320 may provide operational parameters to the power management system 142 (FIG. 1) utilizing one or more communication interfaces 322, 324 (e.g., a wired or wireless network interface). For example, the tap box 302 may include a communication interface 322, 324 for each outlet 316, 318 and/or corresponding rack controller. In accordance with at least one embodiment, the management module 320 may incorporate some or all of the functionality of a corresponding rack controller as described above in more detail with reference to FIG. 2. When needed, at least the storage device 308, the outlets 316, 318, and (in embodiments where it is present) the inverter 310 can allow the tap box 302 to provide UPS-like functionality to any devices connected to the outlets 316, 318. In other words, the tap box 302 can provide electrical power to the connected devices for a limited amount of time.

The tap box 302 may receive a command to perform a tap box operation (e.g., from the power management system 142 of FIG. 1). For example, such commands may include a command to read one or more tap box parameter values including tap box status and component status, a command to update one or more tap box parameter values including component operating values such as operating parameter thresholds and error states, a command to interrupt provision of power by the tap box (e.g., by tripping one or more circuit breakers 312, 314), a command to resume provision of power by the tap box (e.g., by resetting one or more circuit breakers 312, 314), and a command to activate and/or deactivate one or more of the visual indicators 326. For example, such commands may be received, parsed and/or decoded by the management module 320, and the management module 320 may send one or more signals to one or more components 304, 306, 308, 310, 312, 314, 316, 318, 320, 322, 324, 326 of the tap box to activate and/or deactivate tap box functionality corresponding to the received commands.

Tap box components 304, 306, 308, 310, 312, 314, 316, 318, 320, 322, 324, 326 may be partially or wholly contained within a tap box housing 328. The tap box housing 328 may wholly or partially house or contain the tap box components 304, 306, 308, 310, 312, 314, 316, 318, 320, 322, 324, 326. The tap box housing 328 may protect the tap box components 304, 306, 308, 310, 312, 314, 316, 318, 320, 322, 324, 326 from external deliberate or accidental intrusions. In addition, the tap box housing 328 may protect external persons or objects from deliberate or accidental contact with energetic, hot and/or dangerous tap box components 304, 306, 308, 310, 312, 314, 316, 318, 320, 322, 324, 326. The tap box housing 328 may provide one or more surfaces with which tap box components 304, 306, 308, 310, 312, 314, 316, 318, 320, 322, 324, 326 may be attached, e.g., utilizing suitable fasteners. The tap box components 304, 306, 308, 310, 312, 314, 316, 318, 320, 322, 324, 326 may be arranged within the tap box housing 328 to optimize (e.g., minimize) a three dimensional volume occupied by the tap box components 304, 306, 308, 310, 312, 314, 316, 318, 320, 322, 324, 326 and the tap box housing 328. Although not explicitly shown in FIG. 3, the tap box housing 328 may include air vents or the like to provide for air flow across the tap box components 304, 306, 308, 310, 312, 314, 316, 318, 320, 322, 324, 326 to ensure suitable cooling, e.g., levels of cooling at least sufficient to avoid tap box component 304, 306, 308, 310, 312, 314, 316, 318, 320, 322, 324, 326 heating and/or malfunction. The arrangement of the tap box components 304, 306, 308, 310, 312, 314, 316, 318, 320, 322, 324, 326 and/or the volume contained by the tap box housing 328 may also be configured to ensure suitable cooling of the components 304, 306, 308, 310, 312, 314, 316, 318, 320, 322, 324, 326. A form factor of the tap box 302 is a physical shape of the tap box 302, such as a box, cuboid, rectangular prism and/or combinations thereof. Examples of conventional tap box form factors include those of General Electric's (GE) Spectra™ series of electrical busway products, Schneider Electric's Square D™ series of electrical busway products, and/or those in accordance with electrical busway standards such as the National Electrical Manufacturers Association (NEMA) BU 1 series of standards and UL Standard 857. Tap box 302 form factor may depend on design current (e.g., 225-4000 amps three-phase), surge current rating, conductor material (e.g., aluminum or copper) and/or intended position on busway (e.g., center or end). Example conventional tap box form factor dimensions include a height of 18-34 inches (approx. 450-875 mm), a width of 17-48 inches (approx. 425-1225 mm) and a length of 20-46 inches (approx. 500-1175 mm). When overhead, the height dimension may be fixed (e.g., at 18 inches or approx. 450 mm) and overlap with the busway 202 as depicted in FIG. 2.

Figure 4:
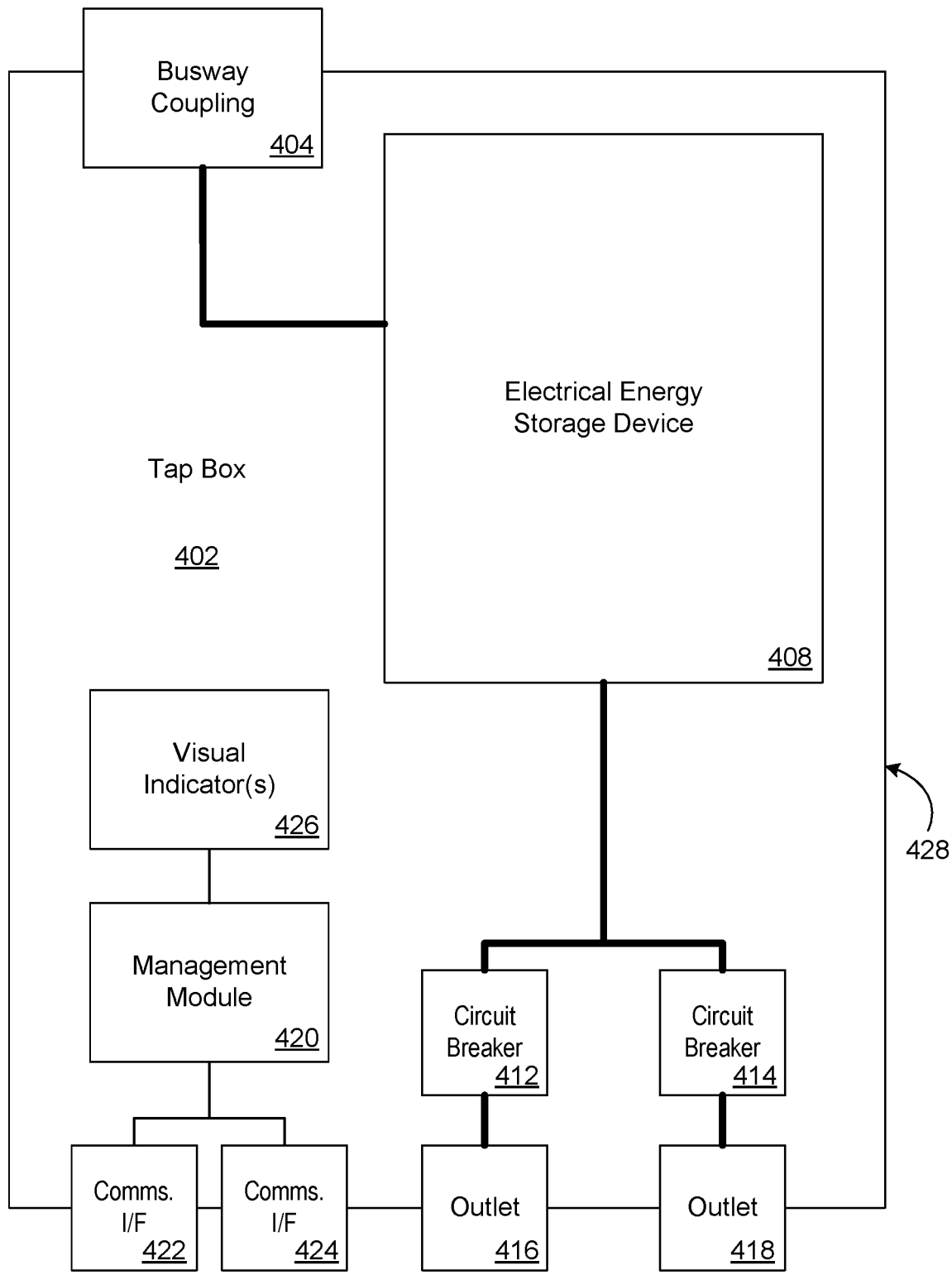
FIG. 4 is a schematic diagram depicting another example power busway tap box with UPS functionality in accordance with at least one embodiment.

FIG. 4 depicts another example power busway tap box with UPS functionality 402 in accordance with at least one embodiment. This example tap box 402 has components 404, 408, 412, 414, 416, 418, 420, 422, 424, 426, 426 corresponding to components 304, 308, 312, 314, 316, 318, 320, 322, 324, 326, 326 of the tap box 302 described above with reference to FIG. 3. However, the tap box 402 is configured to receive DC electric power from the busway coupling 404, store the DC power directly in the electrical energy storage device 408 and provide DC electric power from the electrical energy storage device 408 to electric power consumers utilizing the outlets 416, 418. The example tap box 402 does not require a rectifier or inverter because it does not receive or provide AC electric power. As further alternates to the example tap boxes 302, 402, tap boxes in accordance with at least one embodiment may include a rectifier but not an inverter where AC power is supplied by the busway and DC power is provided to consumers, or an inverter but not a rectifier where DC power is supplied by the busway and AC power is provided to consumers.

Figure 5:
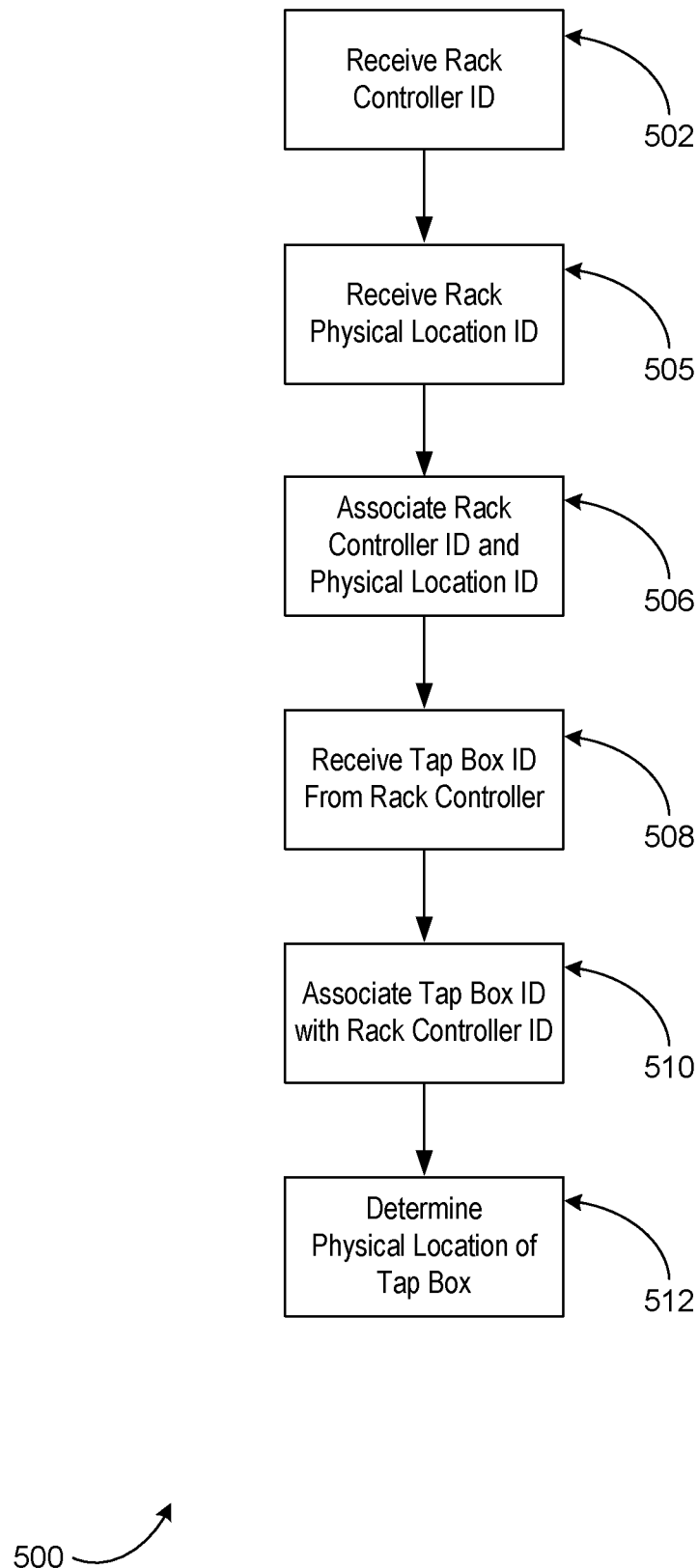
FIG. 5 is a flow diagram depicting example operations in accordance with at least one embodiment.

FIG. 5 depicts example operations for a procedure 500 in accordance with at least one embodiment. The procedure 500 may enable the power management system 142 (FIG. 1) to automatically determine a physical location of a newly installed or moved tap box 302 (FIG. 3). At 502, a rack controller identifier may be received, e.g., by the power management system 142. The rack controller identifier may be any suitable identifier, e.g., a networking address and/or a serial number. At 504, a physical location identifier may be received for the corresponding rack. For example, the power management system 142 may receive the physical location identifier when the corresponding rack is commissioned. For example, FIG. 1 may depict a data center floor plan, and the physical location identifier may identify a rack row and column number in the matrix of equipment racks. At 506, the rack controller identifier may be associated with the physical location identifier, e.g., in a database of the power management system 142.

At 508, a tap box identifier may be received from a rack controller, e.g., by the power management system 142 (FIG. 1). For example, the tap box 302 (FIG. 3) may provide the tap box identifier to the rack controller 206, 210 (FIG. 2) while registering as a managed device utilizing a simple network management protocol (e.g., SNMP), and the rack controller may relay the tap box identifier to the power management system 142. The tap box identifier may be any suitable identifier, e.g., a networking address and/or a serial number. At 510, the tap box identifier may be associated with the rack controller identifier, e.g., in a database of the power management system 142. At 512, a physical location of the tap box may be determined, e.g., by the power management system 142 based at least in part on the identifier of the electrical power busway tap box, the association between the identifier of the electrical power busway tap box and the identifier of the rack controller, and the association between the identifier of the rack controller with the identifier of the physical location of the rack of computer equipment. Such information may be provided to administrators and other users, for example, when diagnosing fault conditions involving the tap box. Alternatively, or in addition, tap boxes may have barcodes encoding tap box identifiers that are scanned and directly associated with physical location identifiers in the database, thereby being independent of rack identifiers and/or locations. For example, physical locations in the data center may have barcodes encoding physical location identifiers that are scanned when the tap box barcodes are scanned thereby associating the two identifiers. For example, the physical location barcodes may be on one or more surfaces of the one or more busways.

Figure 6:
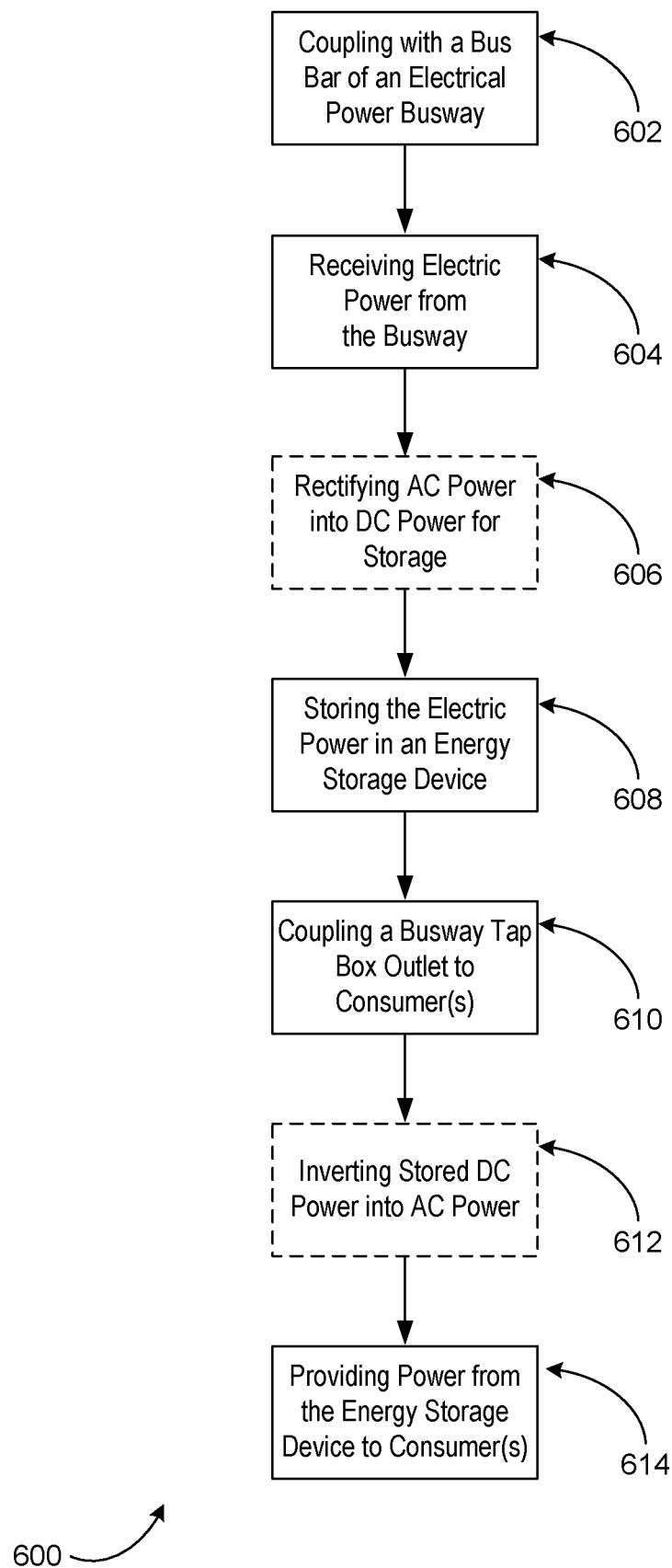
FIG. 6 is a flow diagram depicting further example operations in accordance with at least one embodiment.

FIG. 6 depicts example operations for a procedure 600 in accordance with at least one embodiment. At 602, a tap box may be electrically coupled with a bus bar of an electrical power busway. For example, the tap box 204 (FIG. 2) may be electrically coupled with a bus bar of the busway 202. At 604, electric power may be received from the busway. For example, the busway coupling 304 (FIG. 3) of the tap box 302 may receive the electric power from the busway 202. If received electric power is AC electric power, then at 606 the received electric power may be converted to DC electric power, for example, by the rectifier 306. As indicated by the dashed line style, 606 need not be performed if the received electric power is DC electric power. At 608, the received electric power may be stored in an electrical energy storage device of the tap box, for example, electrical energy storage device 308. At 610, the tap box may be electrically coupled with one or more consumers of electric power, for example, utilizing one or more of the outlets 316, 318. If the consumer(s) of electric power desire AC electric power, then at 612 the stored electric power may be converted to AC electric power, for example, by the inverter 310. As indicated by the dashed line style, 612 need not be performed if the consumer desires DC electric power. At 614, electric power may be provided by the tap box to the one or more consumers. The electric power provided at 614 may continue uninterrupted even when electric power is no longer being received from the busway as at 604.

Some or all of the process 500, 600 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

Figure 7:
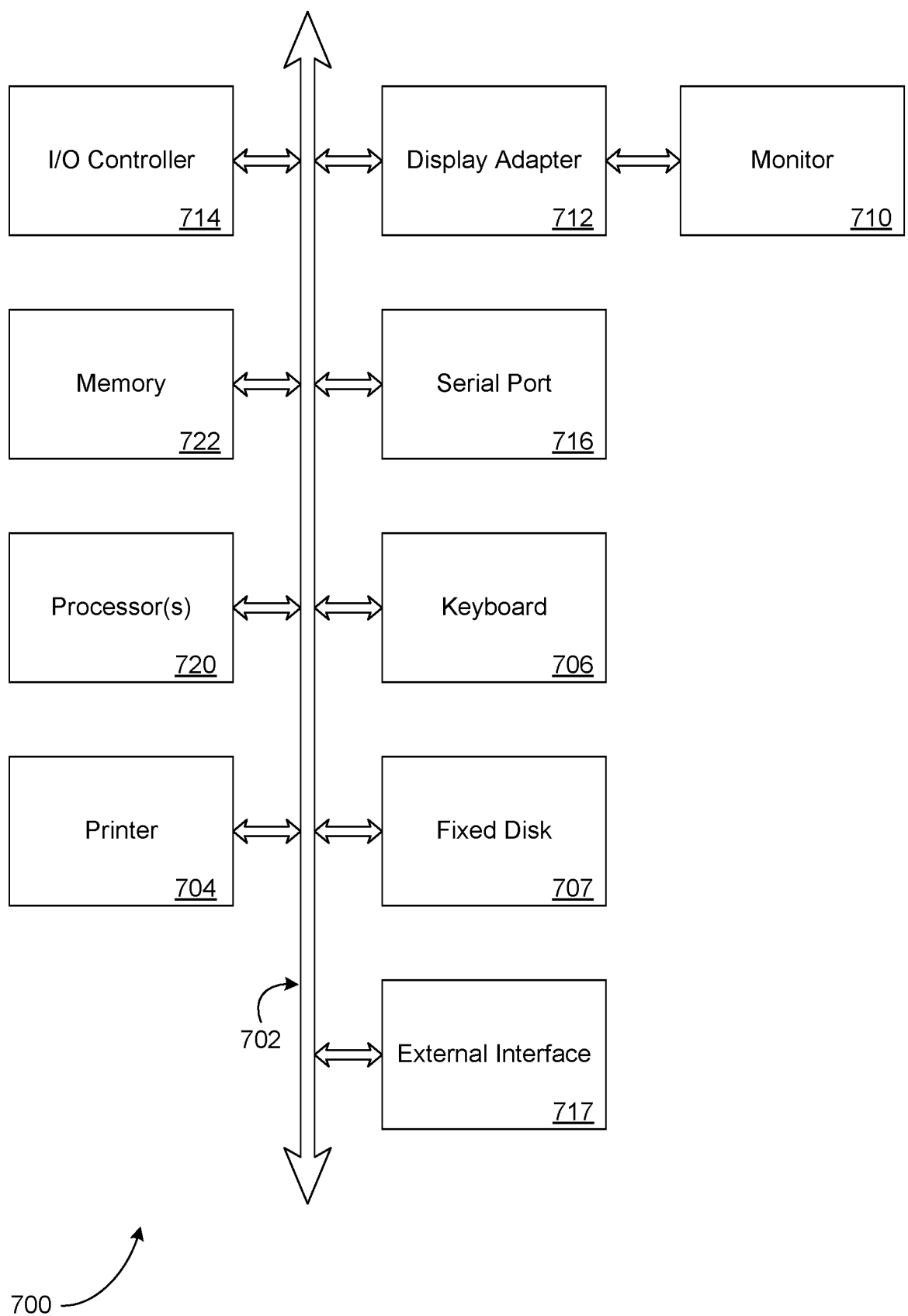
FIG. 7 is a schematic diagram depicting example computer system components in accordance with at least one embodiment.

In accordance with at least some embodiments, the system, apparatus, methods, processes and/or operations for message coding may be wholly or partially implemented in the form of a set of instructions executed by one or more programmed computer processors such as a central processing unit (CPU) or microprocessor. Such processors may be incorporated in an apparatus, server, client or other computing device operated by, or in communication with, other components of the system. As an example, FIG. 7 depicts aspects of elements that may be present in a computer device and/or system 700 configured to implement a method and/or process in accordance with some embodiments of the present disclosure. The subsystems shown in FIG. 7 are interconnected via a system bus 702. Additional subsystems such as a printer 704, a keyboard 706, a fixed disk 708, a monitor 710, which is coupled to a display adapter 712. Peripherals and input/output (I/O) devices, which couple to an I/O controller 714, can be connected to the computer system by any number of means known in the art, such as a serial port 716. For example, the serial port 716 or an external interface 718 can be utilized to connect the computer device 700 to further devices and/or systems not shown in FIG. 7 including a wide area network such as the Internet, a mouse input device, and/or a scanner. The interconnection via the system bus 702 allows one or more processors 720 to communicate with each subsystem and to control the execution of instructions that may be stored in a system memory 722 and/or the fixed disk 708, as well as the exchange of information between subsystems. The system memory 722 and/or the fixed disk 708 may embody a tangible computer-readable medium.

It should be understood that the present disclosure as described herein can be implemented in the form of control logic using computer software in a modular or integrated manner. Alternatively, or in addition, embodiments of the disclosure may be implemented partially or entirely in hardware, for example, with one or more circuits such as electronic circuits, optical circuits, analog circuits, digital circuits, integrated circuits ("IC", sometimes called a "chip") including application-specific ICs ("ASICs") and field-programmable gate arrays ("FPGAs"), and suitable combinations thereof. For example, the management module 320 described above with reference to FIG. 3 may be partially or entirely implemented in hardware. As will be apparent to one of skill in the art, notions of computational complexity and computational efficiency may be applied mutatis mutandis to circuits and/or circuitry that implement computations and/or algorithms. Based on the disclosure and teachings provided herein, a person of ordinary skill in the art will know and appreciate other ways and/or methods to implement the present embodiments using hardware and/or a combination of hardware and software.

Any of the software components, processes or functions described in this application may be implemented as software code to be executed by a processor using any suitable computer language such as, for example, Java, C++ or Perl using, for example, conventional or object-oriented techniques. For example, the management module 320 described above with reference to FIG. 3 may be partially or entirely implemented utilizing software code and/or state machines. The software code may be stored as a series of instructions, or commands on a computer readable medium, such as a random access memory (RAM), a read only memory (ROM), a magnetic medium such as a hard-drive or a floppy disk, or an optical medium such as a CD-ROM. Any such computer readable medium may reside on or within a single computational apparatus, and may be present on or within different computational apparatuses within a system or network.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk. The network can be, for example, a local area network, a wide-area network, a virtual private network, the Internet, an intranet, an extranet, a public switched telephone network, an infrared network, a wireless network, and any combination thereof.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An electrical power busway tap box, comprising:
    a tap box housing;
    a busway coupling coupled with the tap box housing and configured to removably electrically couple the tap box with an electrical power busway in a computer data center such that the tap box is disposed beneath the electrical power busway and above a server rack, wherein the electrical power busway is energized with busway-distributed alternating current (AC) electric power;
    a rectifier coupled with the tap box housing, electrically coupled with the busway coupling, and configured to receive the busway-distributed AC electric power and responsively generate direct current (DC) electric power;
    an uninterruptable power supply (UPS) coupled with and disposed within the tap box housing, the UPS comprising:
        an electrical energy storage device electrically coupled with the rectifier and configured to store the generated DC electric power,
        an inverter electrically coupled with the electrical energy storage device and configured to receive the stored DC electric power and responsively generate inverter-generated AC electric power, and
        an electrical outlet electrically coupled with the inverter and configured to removably electrically couple the tap box with a consumer of AC electric power; and
    wherein the UPS is configured to provide the consumer of AC electric power with at least a portion of the inverter-generated AC electric power.

2. An electrical power busway tap box in accordance with claim 1, wherein additional electrical power busway tap boxes are electrically coupled with the electrical power busway, each of the busway tap boxes being configured to provide backup power to a subset of server racks in a row of server racks.

3. An electrical power busway tap box in accordance with claim 1, wherein the electrical energy storage device comprises a lithium-ion battery, a fuel cell, or a capacitor.

4. An electrical power busway tap box in accordance with claim 1, wherein the electrical outlet is one of a plurality of electrical outlets, and wherein the inverter is configured to supply the inverter-generated AC electric power to the electrical outlets.

5. An apparatus, comprising:
    a tap box housing;
    a busway coupling configured to:
        removably electrically couple with an electrical power busway,
        removably electrically couple with a consumer of electric power, and
        provide the consumer of electric power with electric power from an electrical energy storage device; and
    the electrical energy storage device, wherein the electrical energy storage device is electrically coupled in series between the busway coupling and an electrical outlet, wherein the electrical energy storage device is coupled with and disposed within the tap box housing, wherein the electrical energy storage device is configured to supply electrical power to the consumer of electrical power while the electrical energy storage device receives electrical power from the electrical power busway and while the electrical energy storage device does not receive electrical power from the electrical power busway.

6. An apparatus in accordance with claim 5, further comprising:
    a rectifier electrically coupled in series between the busway coupling and the electrical energy storage device; and
    an inverter electrically coupled in series between the electrical energy storage device and the electrical outlet.

7. An apparatus in accordance with claim 5, further comprising a circuit breaker electrically coupled with in series between the electrical energy storage device and the electrical outlet, wherein the circuit breaker is configured to interrupt supply of electric power from the electrical energy storage device to the electrical outlet when a fault condition is detected.

8. An apparatus in accordance with claim 5, wherein the electrical outlet is one of a plurality of electrical outlets, the electrical outlets each having a corresponding circuit breaker, each of the circuit breakers being capable of independently interrupting supply of electric power to a corresponding one of the electrical outlets from the electrical energy storage device.

9. An apparatus in accordance with claim 5, further comprising a management module configured to monitor operational parameters of components of the apparatus.

10. An apparatus in accordance with claim 9, further comprising a visual indicator communicatively coupled with the management module and configured to visually indicate a status of the apparatus or a monitored component thereof.

11. An apparatus in accordance with claim 9, further comprising a communication interface communicatively coupled with the management module and configured to facilitate communications between the management module and a power management computer system.

12. An apparatus in accordance with claim 5, further comprising a communication interface configured to provide an identifier of the apparatus to a power management system.

13. An apparatus in accordance with claim 5, further comprising a barcode corresponding to an identifier of the apparatus on a surface of the apparatus.

14. A method, comprising:
electrically coupling a tap box with an electrical power busway, wherein the tap box comprises a tap box housing;
receiving, by the tap box, electric power from the electrical power busway;
storing the received electric power in an electrical energy storage device of the tap box, wherein the electrical energy storage device is connected in series between the electrical power busway and an electrical outlet of the tap box, and wherein the electrical energy storage device is disposed within the tap box housing;
electrically coupling the electrical outlet with a consumer of electric power; and
providing, by the tap box, electric power to the consumer of electric power from the electrical energy storage device of the tap box utilizing the electrical outlet of the tap box.

15. A method in accordance with claim 14, further comprising providing, by the tap box, status information for a tap box component.

16. A method in accordance with claim 15, wherein the status information includes an error status.

17. A method in accordance with claim 15, wherein the status information includes a level of electrical energy stored in the electrical energy storage device, a time of last discharge of the electrical energy storage device, an installation date of the electrical energy storage device or a temperature of the electrical energy storage device.

18. A method in accordance with claim 14, further comprising receiving, by the tap box, a command to perform a tap box operation.

19. A method in accordance with claim 18, wherein the command comprises an instruction to interrupt the providing of the electric power to the consumer of electric power by the tap box.

20. A method in accordance with claim 15, wherein the providing of electric power by the tap box to the consumer of electric power continues when the tap box is not receiving electric power from the electrical power busway.

* * * * *